US008716921B2

(12) United States Patent
Pettersson

(10) Patent No.: US 8,716,921 B2
(45) Date of Patent: May 6, 2014

(54) LINEAR VIBRATOR

(75) Inventor: Juha-Pekka Pettersson, Kangasala (FI)

(73) Assignee: Nokia Corporation, Espoo (FI)

( * ) Notice: Subject to any disclaimer, the term of this patent is extended or adjusted under 35 U.S.C. 154(b) by 495 days.

(21) Appl. No.: 12/315,001

(22) Filed: Nov. 25, 2008

(65) Prior Publication Data

US 2010/0127601 A1 May 27, 2010

(51) Int. Cl.
*H01L 41/08* (2006.01)

(52) U.S. Cl.
USPC .......................................... 310/329; 310/312

(58) Field of Classification Search
USPC ............. 310/328, 348, 329, 311, 312, 12.01, 310/332, 331, 330; 361/686; 340/407.1, 340/407.2; 455/567
IPC ....................................................... H01L 41/08
See application file for complete search history.

(56) References Cited

U.S. PATENT DOCUMENTS 6,389,302 B1 * 5/2002 Vance .......................... 455/567
6,768,246 B2 * 7/2004 Pelrine et al. ................ 310/330
2004/0032795 A1 * 2/2004 Baroni et al. .................. 367/37
2006/0091765 A1 5/2006 Oouchi et al. ............... 310/348
2007/0013270 A1 1/2007 Sashida et al. ............... 310/348
2007/0085633 A1 4/2007 Nakatsuka et al. .......... 333/187
2007/0090725 A1 4/2007 Kamiyama et al. .......... 310/324

FOREIGN PATENT DOCUMENTS

GB 2 137 024 A 9/1984
WO WO-00/65805 11/2000

OTHER PUBLICATIONS

M. Renaud et al., "Scavenging Energy From Human Body: Design of a Piezoelectric Transducer", Digest of the 13$^{th}$ International Conference on Solid-State Sensors, Actuators and Microsystems, Seoul, Korea; Jun. 5-9, 2005; ISBN 978-0-7803-8994-6, pp. 784-787.

* cited by examiner

*Primary Examiner* — Thomas Dougherty
*Assistant Examiner* — Karen B Addison
(74) *Attorney, Agent, or Firm* — Harrington & Smith

(57) ABSTRACT

Disclosed herein is an apparatus. The apparatus includes a housing, a first piezo element, a second piezo element, and a mass. The first piezo element and the second piezo element are inside the housing. The mass is movably mounted inside the housing. The mass is configured to move inside the housing in response to a displacement of at least one of the first piezo element and the second piezo element. The mass is simultaneously in direct contact with the first piezo element and the second piezo element.

31 Claims, 7 Drawing Sheets

LINEAR VIBRATOR

BACKGROUND

1. Field of the Invention

The invention relates to an electronic device and, more particularly, to a linear vibrator for an electronic device.

2. Brief Description of Prior Developments

Vibration modules are commonly used in mobile phone products and devices for providing output functionality (such as an alert) in response to incoming calls or messages. Vibration modules generally convert electricity to vibration force to excite (or obtain) a user's attention when, for example, receiving calls in a noisy environment. Vibration modules may also be utilized to provide a user with a silent alert (such as during silent or meeting conditions where the hands free speakers are muted, for example) or where other haptic feedback is utilized. As such, vibration functionality is generally one of the most consumer demanded features for providing an indication of an incoming call or message(s) received on an electronic device.

The demand for continuous size miniaturization generates challenges to implement improved vibrator functionality for electronic devices. Conventional vibrator/vibration modules generally have limited functionality/capacity (such as response times, for example) and have size constraints (such as component height, for example) which may be difficult to integrate in thin devices. Accordingly, there is a need to provide an improved vibrator configuration for electronic devices.

SUMMARY

In accordance with one aspect of the invention, an apparatus is disclosed. The apparatus includes a housing, a first piezo element, a second piezo element, and a mass. The first piezo element and the second piezo element are inside the housing. The mass is movably mounted inside the housing. The mass is configured to move inside the housing in response to a displacement of at least one of the first piezo element and the second piezo element. The mass is simultaneously in direct contact with the first piezo element and the second piezo element.

In accordance with another aspect of the invention, an apparatus is disclosed. The apparatus includes a device housing, electronic circuitry, and a vibrator module. The device housing includes a front face and an opposite back face. The electronic circuitry is in the device housing. The vibrator module is configured to vibrate the device housing. The vibrator module includes a module housing, a first piezo element, and a movable mass. The first piezo element extends from the module housing. The mass is proximate the first element. The first piezo element is configured to be displaced in a direction substantially parallel to the front face and/or the back face of the device housing.

In accordance with another aspect of the invention, a method is disclosed. A device housing having a front face and a back face is provided. Electronic circuitry is installed in the device housing. A vibrator module configured to vibrate the device housing is provided. The vibrator module includes a first piezo element, a second piezo element, and a movable mass. The movable mass is in contact with the first and the second piezo elements.

In accordance with another aspect of the invention, a method is disclosed. A first displacement of at least one piezo element is controlled in a vibrator module of a device. A mass of the vibrator module is moved in a first direction in response to the first displacement of the at least one piezo member. The first direction is substantially parallel to a front face and/or a back face of the device. A second displacement of the at least one piezo element is controlled. The mass is moved in a second direction in response to the second displacement of the at least one piezo member. The second direction is substantially opposite the first direction.

In accordance with another aspect of the invention, a method is disclosed. A first voltage is applied to a first piezo element. The first piezo element is configured to deflect in a first direction in response to the first voltage. The first voltage is applied to a second piezo element. The second piezo element is configured to deflect in the first direction in response to the first voltage. A mass between the first and the second piezo elements is configured to move in a substantially linear fashion within a housing in response to the deflection of at least one of the first and the second piezo elements.

In accordance with another aspect of the invention, a program storage device readable by a machine, tangibly embodying a program of instructions executable by the machine for performing operations to vibrate a housing of a device is disclosed. A first voltage is applied to a first piezo element. The first piezo element is configured to deflect in a first direction in response to the first voltage. The first voltage is applied to a second piezo element. The second piezo element is configured to deflect in the first direction in response to the first voltage. A mass between the first and the second piezo elements is configured to move in a substantially linear fashion within the housing in response to the deflection of at least one of the first and the second piezo elements.

BRIEF DESCRIPTION OF THE DRAWINGS

The foregoing aspects and other features of the invention are explained in the following description, taken in connection with the accompanying drawings, wherein.

DETAILED DESCRIPTION

Figure 1:
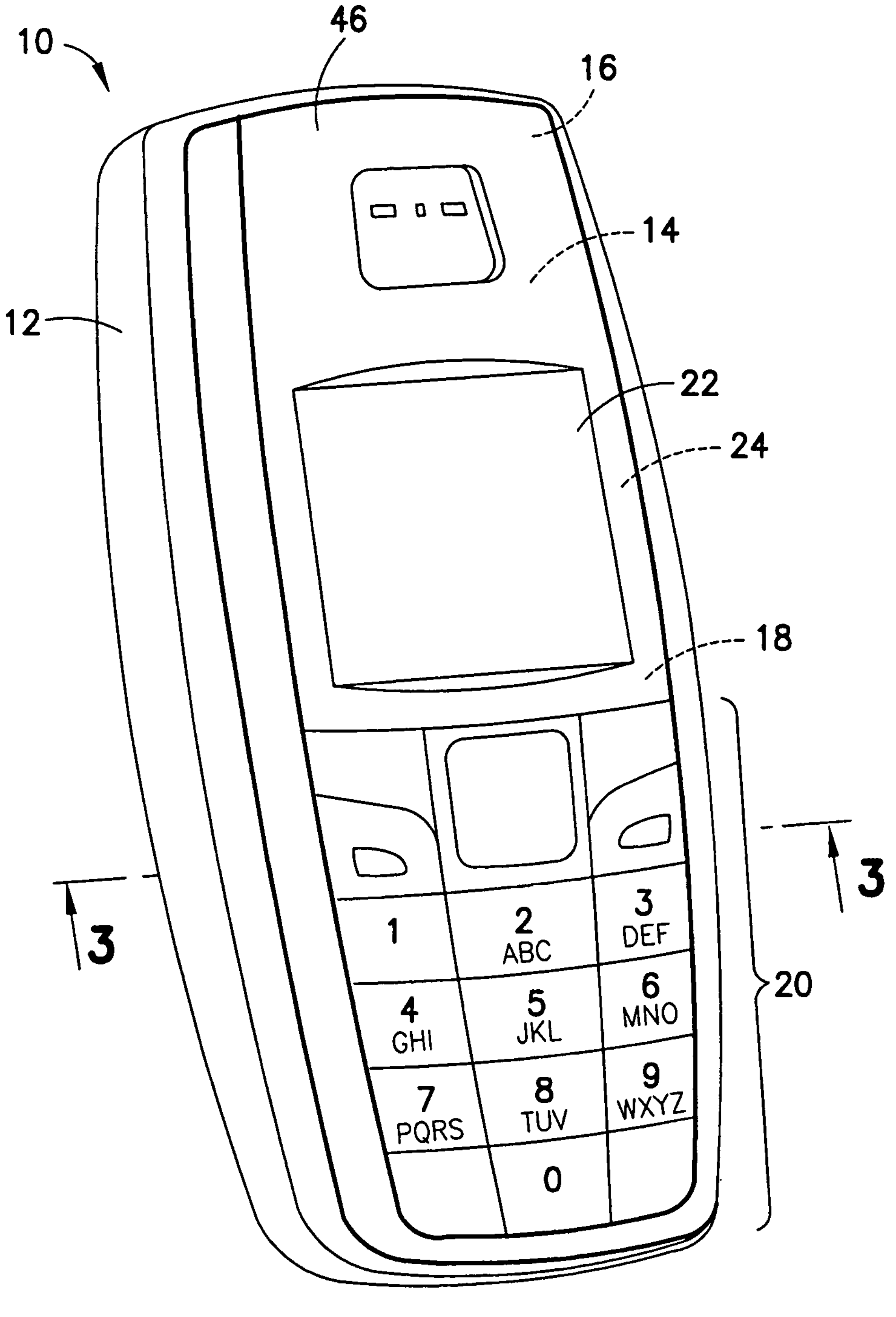
FIG. 1 is a perspective view of an electronic device incorporating features of the invention.

Referring to FIG. 1, there is shown a perspective view of an electronic device 10 incorporating features of the invention.

Although the invention will be described with reference to the exemplary embodiments shown in the drawings, it should be understood that the invention can be embodied in many alternate forms of embodiments. In addition, any suitable size, shape or type of elements or materials could be used.

According to one example of the invention shown in FIG. 1, the device 10 is a multi-function portable electronic device. However, in alternate embodiments, features of the various embodiments of the invention could be used in any suitable type of portable electronic device such as a mobile phone, a gaming device, a music player, a notebook computer, or a PDA, for example. In addition, as is known in the art, the device 10 can include multiple features or applications such as a camera, a music player, a game player, or an Internet browser, for example. The device 10 generally comprises a housing 12, a transceiver 14 connected to an antenna 16, electronic circuitry 18, such as a controller and a memory for example, within the housing 12, a user input region 20 and a display 22. The display 22 could also form a user input section, such as a touch screen. It should be noted that in alternate embodiments, the device 10 can have any suitable type of features as known in the art.

The electronic device 10 further comprises a vibrator module 24 (see also FIGS. 2-6). The vibrator module 24 may be used (as a hardware (HW) component) in the device 10 to convert electricity to a vibration force (actuator) to excite (or capture) a user's attention when receiving calls in a noisy environment, provide a silent alert/function, or provide a vibration for any other suitable mode where a haptics feedback is utilized. However, it should be noted that various embodiments of the invention may be provided in any suitable device mode utilizing vibratory features. According to various exemplary embodiments of the invention, a novel actuator design is provided that produces a strong vibration force with fast response times while allowing for integration in thin products/devices.

The vibrator module 24 comprises a component housing 26, a moveable mass 28, a first piezo element 30 and a second piezo element 32. Various embodiments of the invention provide for linear movement of the mass 28 with the piezo elements 30, 32.

The component housing (or module housing) 26 is mounted inside the device housing 12. According to one embodiment, the component housing 26 may be mounted directly to a printed wiring board (PWB) of the device 10. However, in alternate embodiments the module housing 26 may be provided at any suitable location proximate the device housing 12. For example, a portion of the module housing may be at an exterior portion of the device housing. Additionally, it should be noted that according to various exemplary embodiments of the invention, the component housing 26 (and the vibrator module 24) may be integrated, or mounted, on the PWB in a substantially similar fashion as the conventional vibrator modules. The module housing 26 comprises a top face 34, a bottom face 36, a first side 38, a second side 40, a third side 42, and a fourth side 44. The module housing 26 comprises a general rectangular box shape wherein the bottom face 36 is opposite the top face 34 and wherein the sides 38, 40, 42, 44 extend between the top face 34 and the bottom face 36. However, it should be understood that the in alternate embodiments, any suitable shape may be provided.

Figure 3:
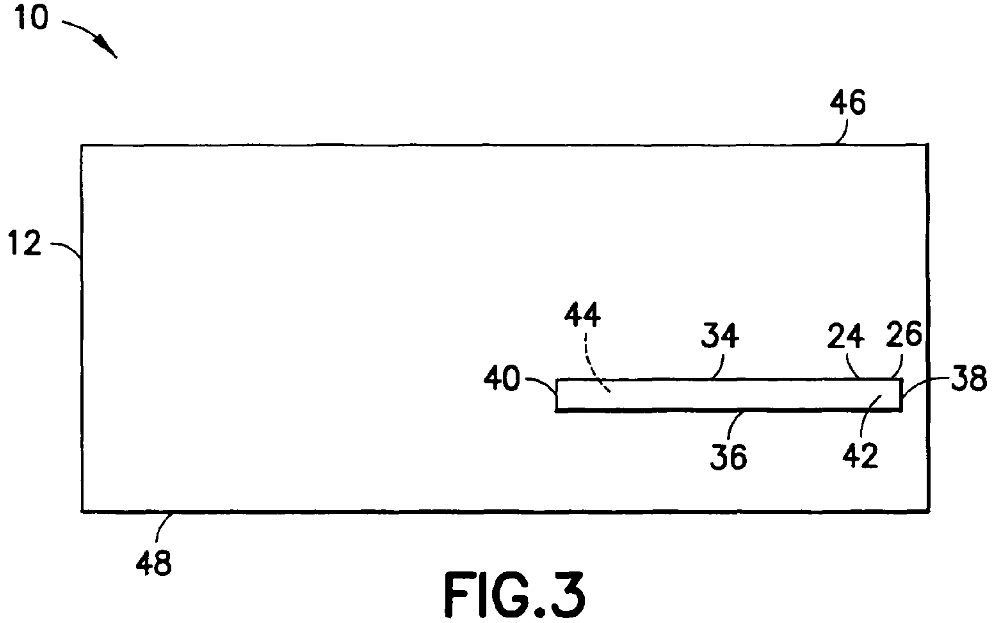
FIG. 3 is cross section view of the device shown in FIG. 1 taken along section line 3-3.

As shown in FIG. 3, the module housing 26 may be disposed within the device housing 12 such that the top face 34 and the bottom face 36 are substantially parallel to a front face 46 and a back face 48 of the device housing 12. However, it should be noted that in alternate embodiments, any suitable orientation may be provided.

The movable mass 28 may be movably mounted inside the module housing 26. The mass 28 also comprises a top face 50, a bottom face 52, a first side 54, a second side 56, a third side 58, and a fourth side 60. The mass 28 may comprise a general race track profile shape. However, in alternate embodiments any suitable shape may be provided. The module housing 26 and mass 28 may be suitably sized and shaped to allow for sliding contact therebetween. The module housing 26 comprises a receiving area 62 having an interior top face 64, an interior bottom face 66, an interior third side 68, and an interior fourth side 70. The slidably mounted configuration (of the mass 28) may be provided between the mass top face 50 and the interior top face 64, the mass bottom face 52 and the interior bottom face 66, the mass third side 58 and the interior third side 68, and the mass fourth side 60 and the interior fourth side 70. This sliding contact configuration allows for the mass to be linearly displaced along a central axis 72 (extending substantially parallel to the sides 38, 40, 42, 44 and faces 34, 36) of the module housing 26. This substantially straight line (or translational) motion may further be provided as linear motion in a direction substantially parallel to the front face 46 and/or the back face 48 of the device housing 12.

The piezo elements 30, 32 extend between the third side 68 and the fourth side 70 of the module housing 26. The first piezo element 30 is proximate the first side 38 of the module housing with a space (or gap) 74 therebetween. Similarly the second piezo element 32 is proximate the second side 40 of the module housing 26 with a space (or gap) 76 therebetween. The piezo elements 30, 32 may be mounted in the housing 26 in any suitable fashion which allows for the above mentioned space (or gap) 74, 76. The space (or gap) 74, 76 may be suitably sized and shaped to allow for a displacement/deflection of the piezo element 30, 32.

The piezo elements 30, 32 may be multi layer piezos. However, in alternate embodiments any suitable type piezo element(s) may be provided. For example, the piezo elements may be beam type piezo structures. In addition, as shown in the figures, soldering terminals 78 may be connected proximate ends of the piezo elements 30, 32.

Figure 4:
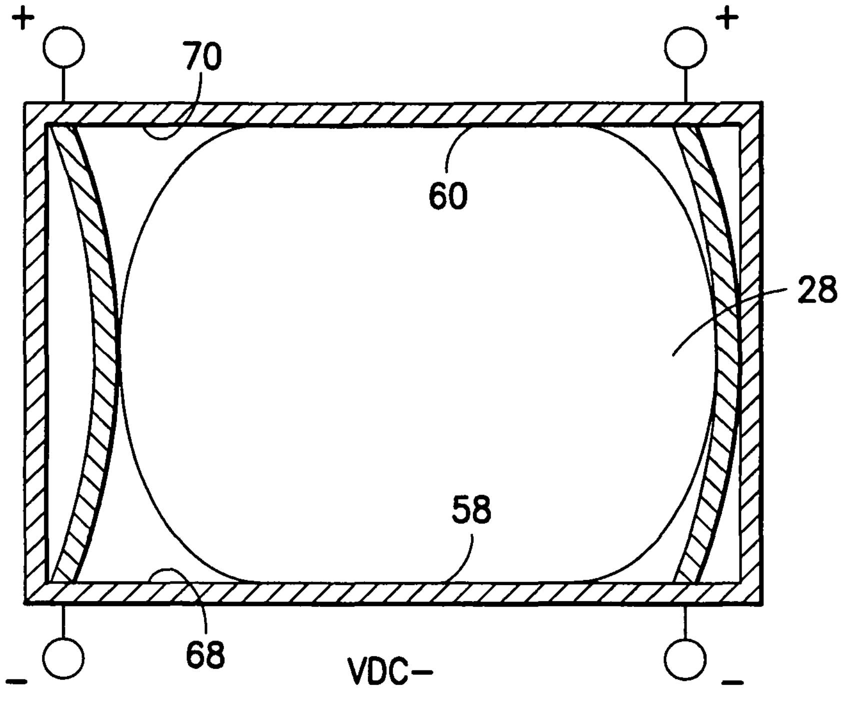
FIG. 4 is a top view of the vibrator module shown in FIG. 2 in a first driving state.
Figure 5:
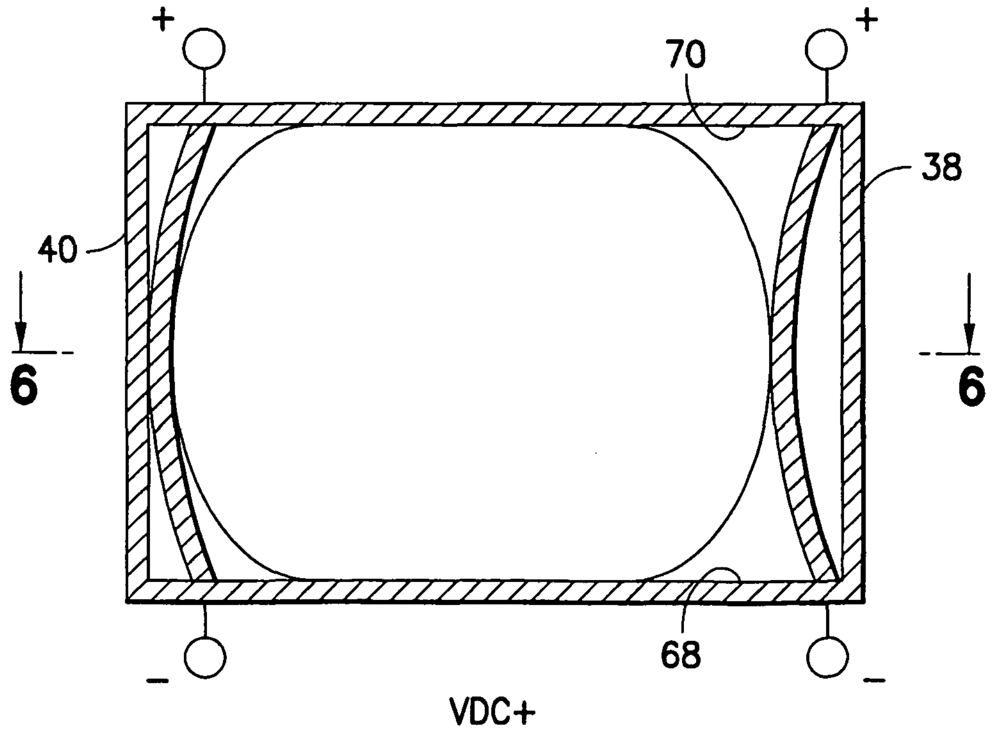
FIG. 5 is a top view of the vibrator module shown in FIG. 2 in a second driving state.
Figure 6:
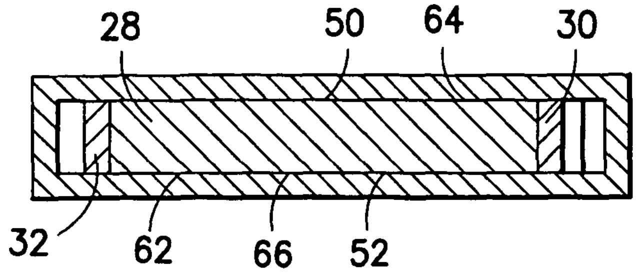
FIG. 6 is a cross section view of the vibrator module shown in FIG. 5 taken along section line 6-6.
Figure 7:
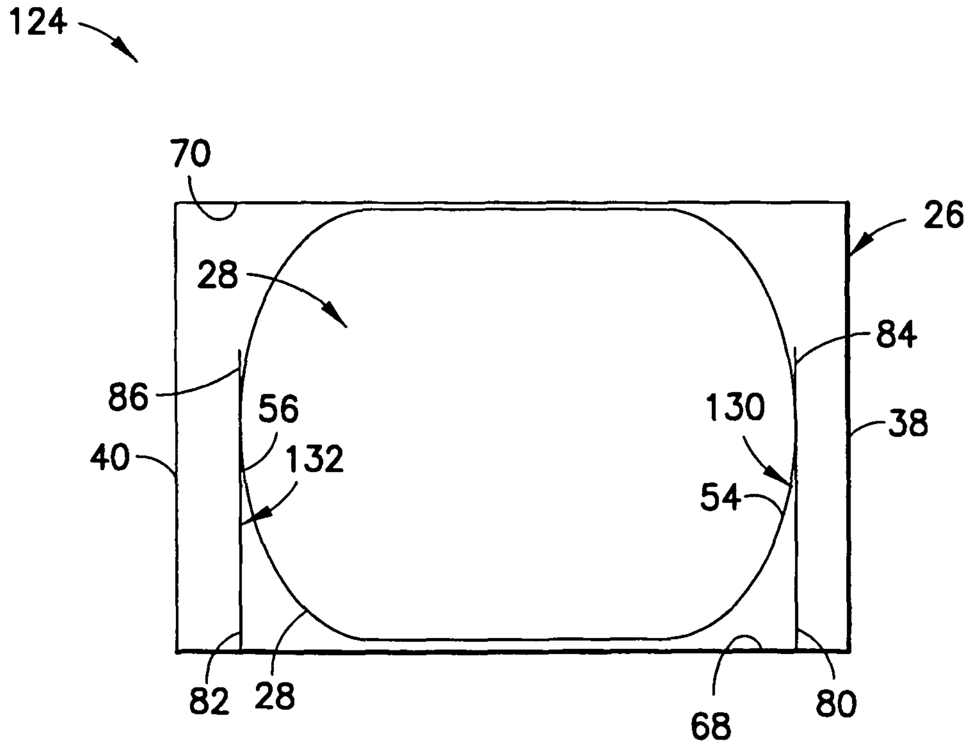
FIG. 7 is a top view of another vibrator module used in the device shown in FIG. 1.
Figure 8:
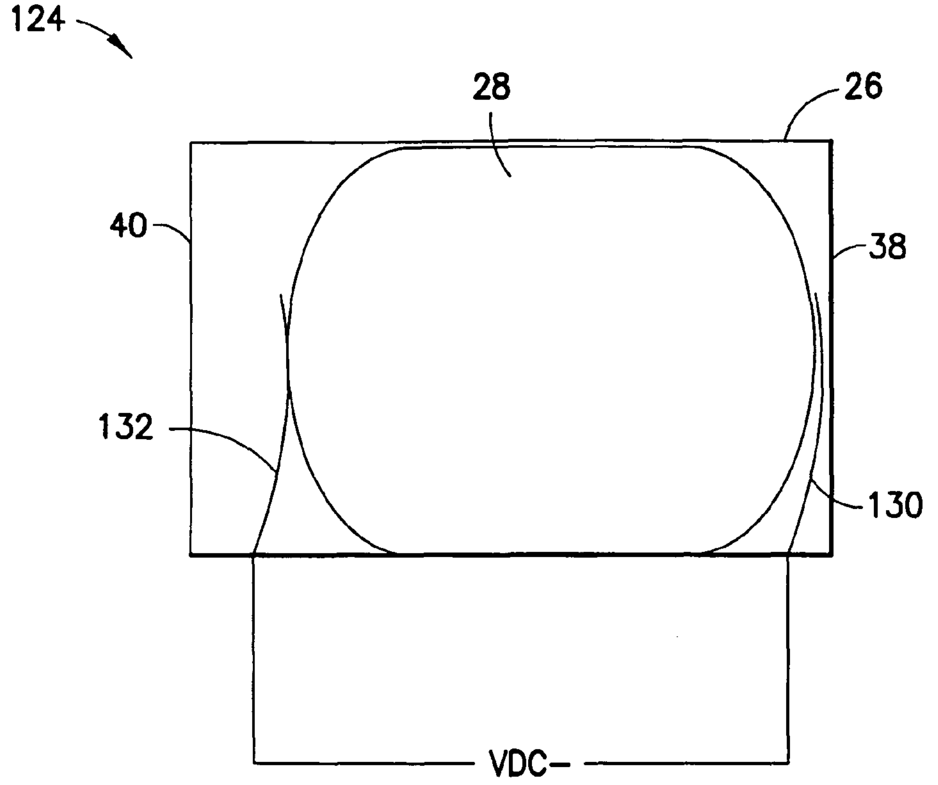
FIG. 8 is a top view of the vibrator module shown in FIG. 7 in a first driving state.

Although FIGS. 2 and 4-6 illustrate a first end of the piezo element 30, 32 connected to the interior third side 68 and a second end of the piezo element 30, 32 connected to the interior fourth side 70, this configuration is not required. For example, referring now also to FIGS. 6-8, a vibrator module 124 according to another embodiment of the invention is shown. The vibrator module 124 is similar to the vibrator module 24 and similar features are similarly numbered. The vibrator module 124 comprises the component housing 26, the moveable mass 28, a first piezo element 130 and a second piezo element 132. One difference between the vibrator module 124 and the vibrator module 24 is that the first and the second piezo elements 130, 132 extend from only a single interior side 68 of the module housing 26. As shown in FIGS. 6-8, first ends 80, 82 of the piezo elements 130, 132 extend from the third side 68 of the housing 26, while second ends 84, 86 of the piezo elements are free ends not connected to the interior fourth side 70 of the housing 26.

Embodiments of the invention provide for a fast (vibration) response by utilizing piezo elements, stronger alerts (or vibration force) by providing a moving mass configuration, and no (unwanted) ringing due two direction support by the piezos.

The mass 28 is disposed between the first piezo element 30, 130 and the second piezo element 32, 132 such that at least a portion of the first side 54 and the second side 56 may be in direct contact with the piezo elements 30, 32, 130, 132.

According to some embodiments of the invention, the first and the second piezo elements are continuously and simultaneously in direct contact with the mass 28 (wherein there is no "open gap" at contact points between the piezo elements and the mass). However, it should be noted that in alternate embodiments, any suitable configuration may be provided. For example, in some embodiments, one or both of the piezo elements may not be in continuous and simultaneous direct contact with the mass.

According to some embodiments of the invention, the two actuators (or piezo elements) may provide for reducing de-emphasis of a mass spring system. In addition, embodiments of the invention provide for fast acceleration of the mass (with very small travel).

Figure 2:
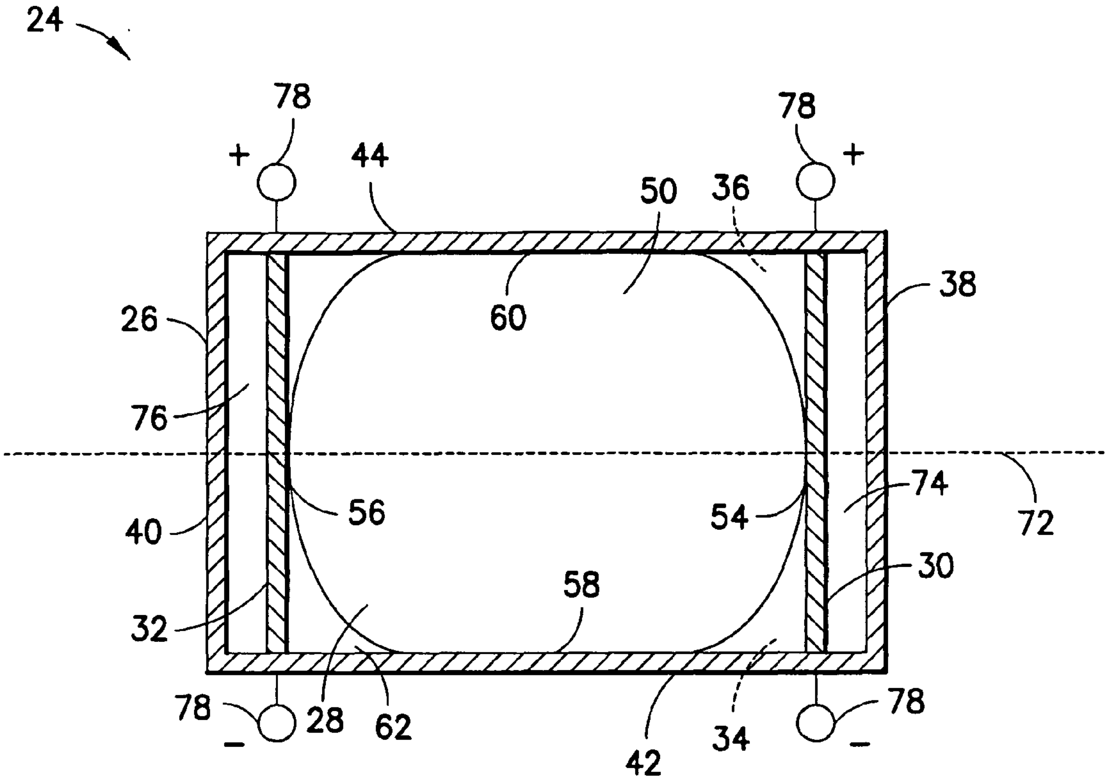
FIG. 2 is a top view of a vibrator module used in the device shown in FIG. 1.
Figure 9:
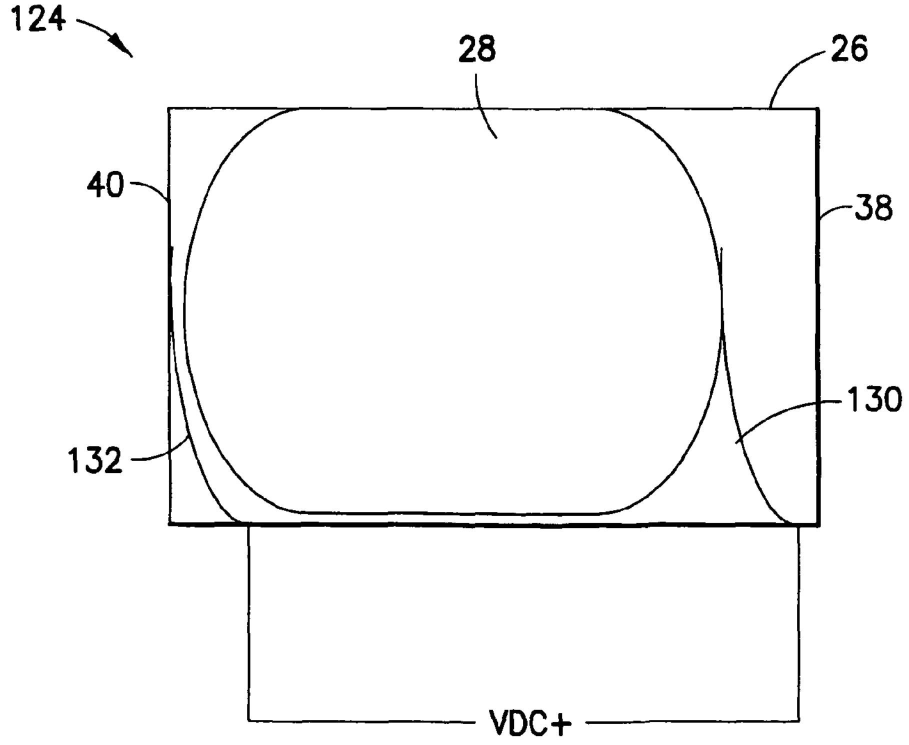
FIG. 9 is a top view of the vibrator module shown in FIG. 7 in a second driving state.

FIGS. 2 and 7 show the vibrator module 24, 124 in a steady state. In this steady state, the mass 28 is substantially centered between the first side 38 and the second side 40 of the housing 26. Application of a voltage to the piezo elements 30, 32, 130, 132 provides for displacement (or deflection) of the piezo elements 30, 32, 130, 132. The mass 28 is configured to be slidably movable between the first side 38 and the second side 40 in response to the movement of the piezo members 30, 32, 130, 132. As the mass 28 is between, and in contact with, the piezo elements, movement of the piezo elements 30, 32, 130, 132 results in a force applied to the mass 28. This applied force results in straight line motion of the mass 28 between the sides of the housing 26. For example, FIGS. 4 and 8 illustrate a negative DC voltage (VDC−) applied to the piezo elements 30, 32, 130, 132, which moves the mass 28 towards the first side 38 of the housing 26. FIGS. 5 and 9 illustrate a positive DC voltage (VDC+) applied to the piezo elements 30, 32, 130, 132, which moves the mass 28 towards the second side 40 of the housing 26. Alternating between the positive and negative voltage results in a back and forth motion between the first side and the second side of the housing. This back and forth motion provides a vibratory effect on the module housing 26. It should be noted that although the example above describes the mass moving towards the first side when a negative voltage is applied and the mass moving towards the second side when a positive voltage is applied, this configuration is not required. For example, in alternate embodiments the mass may move towards the second side when a negative voltage is applied and the mass may move towards the first side when a positive voltage is applied. However, any suitable configuration may be provided.

According to various embodiments of the invention, the vibrator module 24, 124 provides a linear type vibrator (with piezo elements) configured for providing a strong vibration force, with fast response times, while also allowing for a thin component design configuration.

As shown in the figures, the weight of the movable mass 28 may be supported within the housing 26 from one contact point by the two piezo elements. According to some embodiments of the invention, the working principle of the piezo elements is that they are driven at a resonance frequency. The vibrator module 24, 124 may also have its own resonance frequency (and there can be several, depending on loads at the piezo elements) and it can be classified as a forced oscillator. According to some examples of the invention, some resonance frequencies may be avoided such that the best quality haptic response is achieved while minimizing any ringing phenomenon and long "breaking" issues.

According to various exemplary embodiments of the invention, a driving signal (applied to the piezo elements) could be about 3-7.5 Vrms audio signal with haptics optimized frequency window, for example from about 100 Hz to 500 Hz. It should be noted that although there are two piezo elements, some examples of the invention may provide for both piezo elements to have the same signal and same polarity in order to reach optimized performance to move the weight accurately without delays and long fall back times. But of course, it should be understood that in alternate embodiments, each of the piezo elements may be driven separately.

Any suitable driver for the vibrator module may be provided. For example, in some embodiments of the invention, the driver may be a high efficiency charge pump (ceramic piezo driver circuitry), wherein supply voltage and output bandwidth includes the ranges within suitable specifications. The output voltage may be overvoltage protected (as piezo elements may generate voltage when deflected/displaced) and DC blocked output for protecting the piezo elements. Additionally, environmental aspects such as noise and signals levels may be considered as well.

According to some embodiments of the invention, the linear type vibrator module 24, 124 may be used as part of gaming and/or music playback functions when a suitable driver is accommodated with the playback system. For instance, the module 24, 124 may provide faster response times where vibration type playback could be synchronized to music or a ringtone. For example, when the device 10 is in a 'silent' or 'meeting' mode, ringtones, music or other audible device indicators may be muted (and thus, are not playing). However, the system could be configured to analyze the frequency response of the music file (adaptively) by techniques such as octave band analysis, windowed frequency spectrum in segments, and/or windowing by applying Fourier analysis, for example. It should be understood that these are merely non-limiting examples and any suitable analysis technique may be provided. According to some embodiments of the invention, it should be noted that with respect to the octave band, the number of octaves can be different within a specific frequency range which may be pre-defined, for example between about 100 Hz and about 10000 Hz, and each octave may have a dedicated center frequency. This would allow the vibrator module 24, 124 to be functionally operable such that the module 24, 124 provides vibrations corresponding to the analyzed frequency. For example, in one embodiment the module 24, 124 may vibrate in a specific pattern which is dependent on the content of the music/ringtone file. This would allow a user to recognize who is calling based on individualized vibration (corresponding to the ringtone) which may specific for a certain caller(s). This provides for a user of the device 10 to distinguish between different callers by sensing different vibration patterns (as users can set ringtones individually for their desired contacts). Additionally, it should be noted that although the examples above describe the vibration patterns with respect to ring tones and music files, alternate embodiments may utilize the vibration patterns in any suitable fashion.

Figure 10:
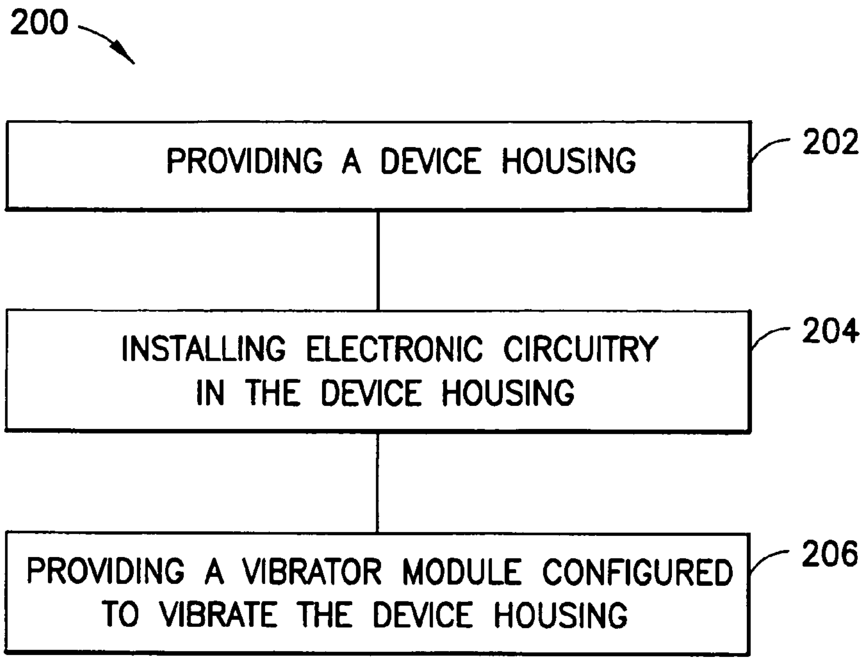
FIG. 10 is a block diagram of an exemplary method of the device shown in FIG. 1.

FIG. 10 illustrates a method 200. The method includes the following steps. Providing a device housing having a front face and a back face (step 202). Installing electronic circuitry in the device housing (step 204). Providing a vibrator module configured to vibrate the device housing, wherein the vibrator module comprises a first piezo element, a second piezo element, and a movable mass, and wherein the movable mass is in contact with the first and the second piezo elements (step 206). It should be noted that any of the above steps may be performed alone or in combination with one or more of the steps.

Figure 11:
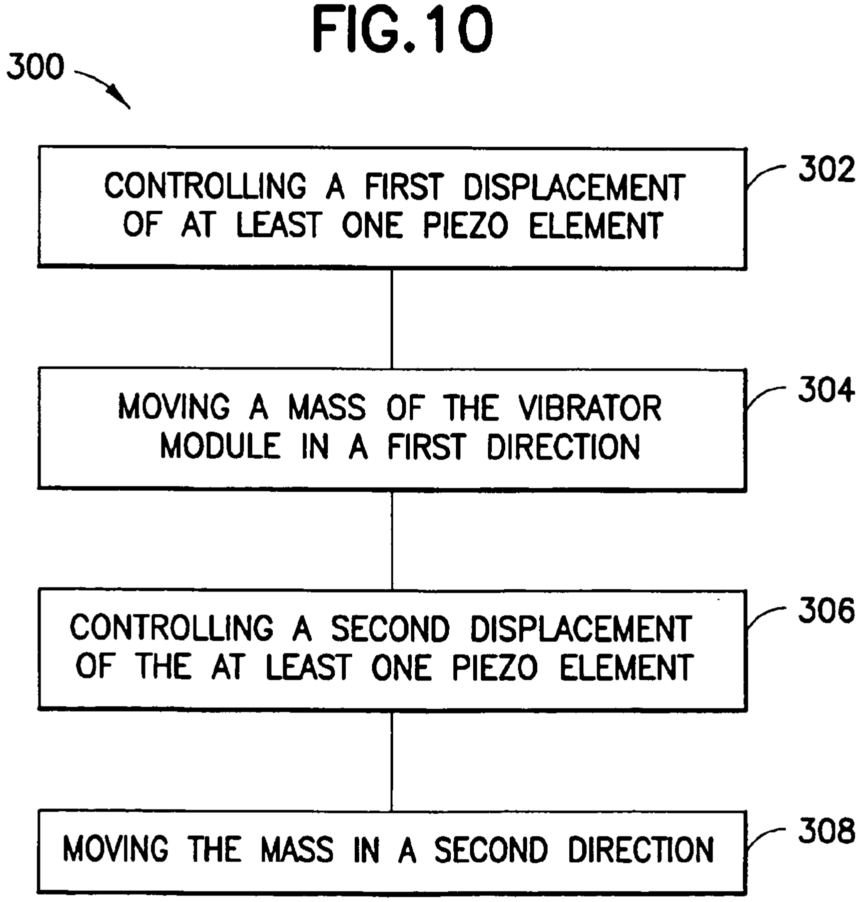
FIG. 11 is a block diagram of another exemplary method of the device shown in FIG. 1

FIG. 11 illustrates a method 300. The method includes the following steps. Controlling a first displacement of at least one piezo element in a vibrator module of a device (step 302).

Moving a mass of the vibrator module in a first direction in response to the first displacement of the at least one piezo member, wherein the first direction is substantially parallel to a front face and/or a back face of the device (step 304). Controlling a second displacement of the at least one piezo element (step 306). Moving the mass in a second direction in response to the second displacement of the at least one piezo member, wherein the second direction is substantially opposite the first direction (step 308). It should be noted that any of the above steps may be performed alone or in combination with one or more of the steps.

Figure 12:
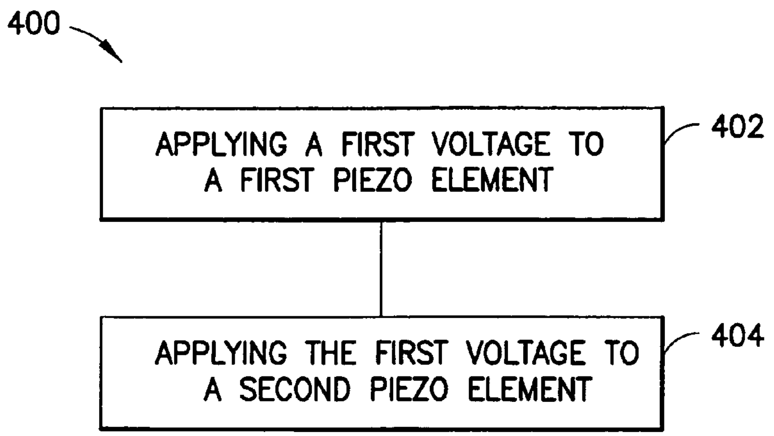
FIG. 12 is a block diagram of another exemplary method of the device shown in FIG. 1.

FIG. 12 illustrates a method 400. The method includes the following steps. Applying a first voltage to a first piezo element, wherein the first piezo element is configured to deflect in a first direction in response to the first voltage (step 402). Applying the first voltage to a second piezo element, wherein the second piezo element is configured to deflect in the first direction in response to the first voltage, and wherein a mass between the first and the second piezo elements is configured to move in a substantially linear fashion within a housing in response to the deflection of at least one of the first and the second piezo elements (step 404). It should be noted that any of the above steps may be performed alone or in combination with one or more of the steps.

Figure 13:
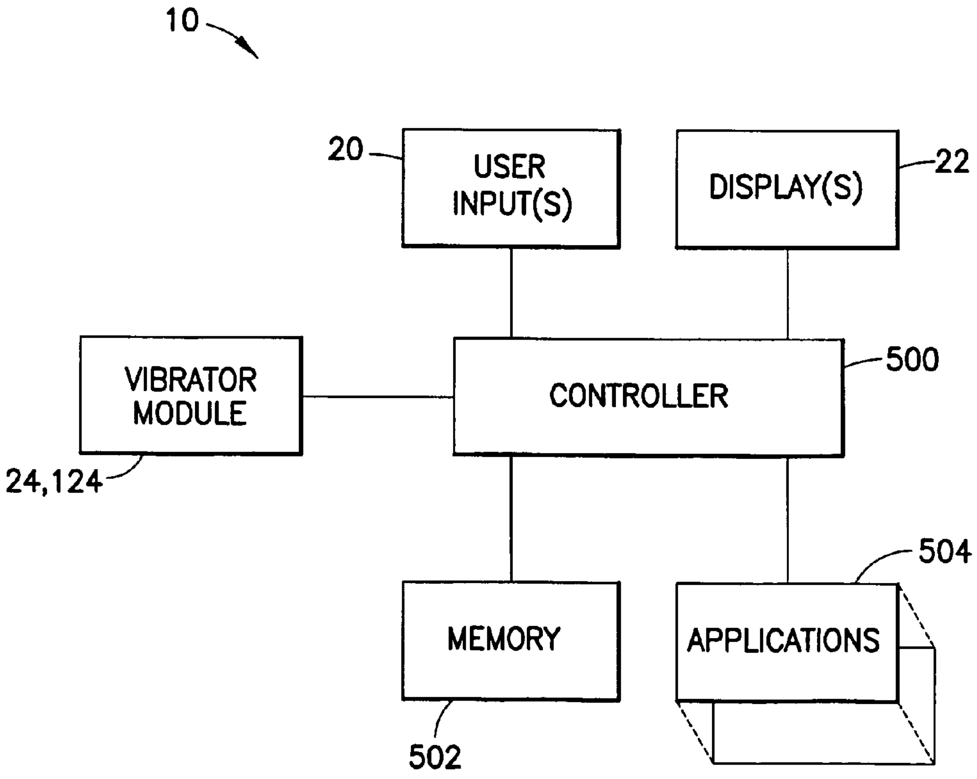
FIG. 13 is a schematic drawing illustrating components of the electronic device shown in FIG. 1.

Referring now also to FIG. 13, the device 10 generally comprises a controller 500 such as a microprocessor for example. The electronic circuitry includes a memory 502 coupled to the controller 500, such as on a printed circuit board for example. The memory 502 could include multiple memories including removable memory modules for example. The device 10 has applications 504, such as software, which the user can use. The applications can include, for example, a telephone application, an Internet browsing application, a game playing application, a digital camera application, etc. These are only some examples and should not be considered as limiting. One or more user inputs 20 are coupled to the controller 500 and one or more displays 22 are coupled to the controller 500. The vibrator module 24, 124 is also coupled to the controller 500. The device 10 is preferably programmed to automatically control the vibrator module 24, 124. However, in an alternate embodiment, this might not be automatic. The user might need to actively select a vibration feature in the application/mode being used/run.

Technical effects of any one or more of the exemplary embodiments of the invention provide a linear type vibrator (with piezo elements) configured for thin mobile phone products with a fast response and more effective vibration force when compared to conventional configurations. Conventional vibrator module (actuator) configurations may comprise DC motor driven components which may not provide adequate response times (for example, from software control to movement) for device vibration modes such as a silent alert mode or any other mode utilizing a haptics feature.

The conventional vibrator modules based on DC motors or moving coil technologies (such as coil/magnet driven linear actuators, multilayer piezo actuators, DC motor actuators, step motor actuators, for example) may not be efficient in terms of mechanical size and functionality and therefore may be designed for different categories/applications. They are generally designed for specific needs across mobile phone products and may be limited depending on the mobile phone product size (such as component height, for example), weight and application category (such as gaming applications, general communication, for example). Additionally, limitations regarding size constraints become evident as the conventional vibrator module configurations can be difficult to integrate in today's thin and small products (due to their size and specifications). Some conventional vibrator module configurations may also produce unwanted ringing (or vibrating) issues (for example, ringing of mass-spring system).

Technical effects of any one or more of the exemplary embodiments of the invention may provide for a reduced product/device size (especially in height) and a stronger actuator force, when compared to conventional modules. For example, various embodiments of the invention may provide for a vibrator module thickness can be relatively low (such as about 2.0 mm). Additionally, according to some embodiments of the invention, unwanted ringing and breaking problems may be alleviated. Further technical effects according to various embodiments of the invention provide for improved electromagnetic interference (EMI) conditions as conventional magnet and moving coil (or dc motor components) generally interfere and cause EMI issues with other components in mobile phone products.

According to one example of the invention, an apparatus is disclosed. The apparatus includes a housing, a first piezo element, a second piezo element, and a mass. The first piezo element and the second piezo element are inside the housing. The mass is movably mounted inside the housing. The mass is configured to move inside the housing in response to a displacement of at least one of the first piezo element and the second piezo element. The mass is simultaneously in direct contact with the first piezo element and the second piezo element.

According to one example of the invention, an apparatus is disclosed. The apparatus includes a device housing, electronic circuitry, and a vibrator module. The device housing includes a front face and an opposite back face. The electronic circuitry is in the device housing. The vibrator module is configured to vibrate the device housing. The vibrator module includes a module housing, a first piezo element, and a movable mass. The first piezo element extends from the module housing. The mass is proximate the first element. The first piezo element is configured to be displaced in a direction substantially parallel to the front face and/or the back face of the device housing.

According to one example of the invention, a program storage device readable by a machine, tangibly embodying a program of instructions executable by the machine for performing operations to vibrate a housing of a device is disclosed. A first voltage is applied to a first piezo element. The first piezo element is configured to deflect in a first direction in response to the first voltage. The first voltage is applied to a second piezo element. The second piezo element is configured to deflect in the first direction in response to the first voltage. A mass between the first and the second piezo elements is configured to move in a substantially linear fashion within the housing in response to the deflection of at least one of the first and the second piezo elements.

It should be understood that components of the invention can be operationally coupled or connected and that any number or combination of intervening elements can exist (including no intervening elements). The connections can be direct or indirect and additionally there can merely be a functional relationship between components.

It should be understood that the foregoing description is only illustrative of the invention. Various alternatives and modifications can be devised by those skilled in the art without departing from the invention. Accordingly, the invention is intended to embrace all such alternatives, modifications and variances which fall within the scope of the appended claims.

What is claimed is:

1. An apparatus comprising:

a housing comprising a first lateral side and a second lateral side;

a first piezo element and a second piezo element inside the housing wherein the first and second piezo elements are proximate the first and second lateral sides with a space therebetween configured to allow a displacement of at least one of said piezo elements; and a mass movably mounted inside the housing, wherein the mass is configured to move inside the housing between the first and second lateral sides in response to the displacement of at least one of the first piezo element and the second piezo element, wherein at least one of the first and second piezo element is configured to be driven at a resonance frequency, and wherein the mass is simultaneously in contact with the first piezo element and the second piezo element, and wherein the apparatus is configured to provide a vibrator functionality for a portable electronic device.

2. An apparatus as in claim 1 wherein the mass is slidably mounted inside the housing.

3. An apparatus as in claim 1 wherein at least one of the first and the second piezo elements comprises a multilayer piezo.

4. An apparatus as in claim 1 wherein the housing further comprises a top face, and a bottom face, wherein the bottom face is opposite the top face, wherein the first lateral side and the second lateral side are between the top face and the bottom face, and wherein the mass is configured to slide between the first lateral side and the second lateral side in response to the displacement of at least one of the first piezo element and the second piezo element.

5. An apparatus as in claim 4 wherein the first piezo element is proximate the first lateral side.

6. An apparatus as in claim 4 wherein the second piezo element is proximate the second lateral side.

7. A device comprising:

a device housing;

electronic circuitry in the device housing; and an apparatus as in claim 1 connected to the housing.

8. An apparatus as in claim 1 wherein the first and second piezo elements are configured to be driven by a same driving signal and polarity or configured to be driven separately.

9. An apparatus as in claim 1 wherein the resonance frequency is in a range between about 100 Hz and about 500 Hz.

10. An apparatus comprising:

a housing;

a first piezo element and a second piezo element inside the housing; and a mass movably mounted inside the housing, wherein the mass is configured to move inside the housing in response to a displacement of at least one of the first piezo element and the second piezo element, and wherein the mass is simultaneously in contact with the first piezo element and the second piezo element, wherein a first end of the mass is in contact with the first piezo element, wherein a second end of the mass is in contact with the second piezo element, and wherein at least one of the first and second piezo element is configured to be driven at a resonance frequency.

11. An apparatus as in claim 10 wherein the first and second piezo elements are configured to be driven by a same driving signal and polarity or configured to be driven separately.

12. An apparatus as in claim 10 wherein the resonance frequency is in a range between about 100 Hz and about 500 Hz.

13. An apparatus comprising:

a device housing comprising a front face and an opposite back race;

electronic circuitry in the device housing; and a vibrator module configured to vibrate the device housing, wherein the vibrator module comprises a module housing, a first piezo element, and a movable mass, wherein the first piezo element comprises a multilayer piezo, wherein the first piezo element extends from the module housing, wherein the mass is proximate the first element, and wherein the first piezo element is configured to be displaced in a direction substantially parallel to the front face and/or the back face of the device housing.

14. An apparatus as in claim 13 wherein the vibrator module comprises a second piezo element, and wherein the mass is between the first piezo element and the second piezo element.

15. An apparatus as in claim 14 wherein the first piezo element and the second piezo element are configured to be simultaneously in contact with the movable mass.

16. An apparatus as in claim 13 wherein a first end of the first piezo element extends from a side of the module housing.

17. An apparatus as in claim 13 wherein a first end of the first piezo element extends from a side of the module housing, and wherein a second end of the first piezo elements extends from another opposite side of the module housing.

18. An apparatus as in claim 13 wherein a display is at the front face of the device housing.

19. An apparatus as in claim 13 wherein the movable mass is configured to move in a direction substantially parallel to the front face and/or the back face of the device housing.

20. An apparatus as in claim 13 wherein a portion of the module housing is configured to support the movable mass, and wherein the portion of the module housing is configured to allow translational movement of the movable mass.

21. An apparatus as in claim 13 wherein the apparatus is a portable electronic device.

22. A method comprising:

controlling a first displacement of at least one piezo element in a vibrator module of a device;

moving a mass of the vibrator module in a first direction in response to the first displacement of the at least one piezo member, wherein the first direction is substantially parallel to a front face and/or a back face of the device;

controlling a second displacement of the at least one piezo element; and moving the mass in a second direction in response to the second displacement of the at least one piezo member, wherein the second direction is substantially opposite the first direction;

wherein the at least one piezo element further comprises two piezo elements, wherein the mass is between the two piezo elements, and wherein the two piezo elements are configured to be in contact with the mass.

23. A method as in claim 22 wherein the moving of the mass in the first direction further comprises translating the mass in the first direction.

24. A method as in claim 22 wherein the controlling of the first displacement of the at least one piezo element further comprises applying a force to the mass in the first direction.

25. A method comprising:

applying a first voltage to a first piezo element, wherein the first piezo element is configured to deflect in a first direction in response to the first voltage; and applying the first voltage to a second piezo element, wherein the second piezo element is configured to deflect in the first direction in response to the first voltage, and wherein a mass between the first and the second piezo elements is configured to move in a substantially linear fashion within a housing in response to the deflection of at least one of the first and the second piezo elements.

26. A method as in claim 25 further comprising:

applying a second voltage to the first piezo element, wherein the first piezo element is configured to deflect in a second direction in response to the second voltage.

27. A method as in claim 26 further comprising:

applying the second voltage to the second piezo element, wherein the second piezo element is configured to deflect in the second direction in response to the second voltage, and wherein the mass between the first and the second piezo elements is configured to move in a substantially linear fashion within the housing in response to the deflection of at least one of the first and the second piezo elements.

28. A method as in 25 wherein the first and the second piezo elements are configured to be in contact with the mass.

29. A program storage device readable by a machine, tangibly embodying a program of instructions executable by the machine for performing operations to vibrate a housing of a device, the operations comprising:

applying a first voltage to a first piezo element, wherein the first piezo element is configured to deflect in a first direction in response to the first voltage; and applying the first voltage to a second piezo element, wherein the second piezo element is configured to deflect in the first direction in response to the first voltage, and wherein a mass between the first and the second piezo elements is configured to move in a substantially linear fashion within the housing in response to the deflection of at least one of the first and the second piezo elements.

30. A program storage device as in claim 29 further comprising:

applying a second voltage to the first piezo element, wherein the first piezo element is configured to deflect in a second direction in response to the second voltage.

31. A program storage device as in claim 30 further comprising:

applying the second voltage to the second piezo element, wherein the second piezo element is configured to deflect in the second direction in response to the second voltage, and wherein the mass between the first and the second piezo elements is configured to move in a substantially linear fashion within the housing in response to the deflection of at least one of the first and the second piezo elements.

* * * * *

UNITED STATES PATENT AND TRADEMARK OFFICE

CERTIFICATE OF CORRECTION

PATENT NO. : 8,716,921 B2
APPLICATION NO. : 12/315001
DATED : May 6, 2014
INVENTOR(S) : Juha-Pekka Pettersson It is certified that error appears in the above-identified patent and that said Letters Patent is hereby corrected as shown below:

In the Claims:

In Claim 13:
Column 10, line 3: "race" should be deleted and --face-- should be inserted.

Signed and Sealed this
Twenty-second Day of July, 2014

Michelle K. Lee

Michelle K. Lee
*Deputy Director of the United States Patent and Trademark Office*